(12) United States Patent
Zhang

(10) Patent No.: US 9,363,869 B2
(45) Date of Patent: Jun. 7, 2016

(54) OPTICAL NAVIGATION MODULE WITH DECORATION LIGHT USING INTERFERENCE AVOIDANCE METHOD

(75) Inventor: Zhen Kent Zhang, Waterloo (CA)

(73) Assignee: BlackBerry Limited, Waterloo, Ontario (CA)

( * ) Notice: Subject to any disclaimer, the term of this patent is extended or adjusted under 35 U.S.C. 154(b) by 1121 days.

(21) Appl. No.: 13/343,577

(22) Filed: Jan. 4, 2012

(65) Prior Publication Data

US 2013/0169166 A1    Jul. 4, 2013

(51) Int. Cl.
*H05B 37/02* (2006.01)
*H05B 39/04* (2006.01)
*H05B 41/36* (2006.01)

(52) U.S. Cl.
CPC .................................. *H05B 37/0272* (2013.01)

(58) Field of Classification Search
None
See application file for complete search history.

(56) References Cited

U.S. PATENT DOCUMENTS

| | | | |
|---|---|---|---|
| 6,810,135 B1 | 10/2004 | Berenz et al. | |
| 6,959,102 B2 | 10/2005 | Peck | |
| 7,796,268 B2 | 9/2010 | Cabaniss et al. | |
| 7,825,895 B2 | 11/2010 | Bynum et al. | |
| 8,638,045 B2* | 1/2014 | Kunst et al. | 315/291 |
| 2006/0028442 A1* | 2/2006 | Bynum et al. | 345/157 |
| 2010/0141444 A1 | 6/2010 | Brown et al. | |
| 2011/0205154 A1 | 8/2011 | Lowles et al. | |
| 2011/0205179 A1 | 8/2011 | Braun | |
| 2011/0267238 A1* | 11/2011 | Nekozuka | 343/702 |
| 2011/0267268 A1* | 11/2011 | Lum et al. | 345/158 |

FOREIGN PATENT DOCUMENTS

| | | |
|---|---|---|
| CA | 2732946 A1 | 8/2011 |
| CA | 2732964 A1 | 8/2011 |

OTHER PUBLICATIONS

Extended European Search report mailed Jun. 28, 2012, in corresponding European patent application No. 12150200.9.
Markus, Schutti—Retrieved Oct. 1, 2003. Infrared communications using the IrDA standard. pp. 1-7.
Wireless Control Solution. Retrieved Apr. 5, 2011. http://wirelesscontrolsolution.com/InfraRed.htm. pp. 1-2.
The International Search report and the Written Opinion of the International Searching Authority mailed Feb. 26, 2013, in corresponding PCT patent application No. PCT/CA2012/050921.

* cited by examiner

*Primary Examiner* — Anh Tran
(74) *Attorney, Agent, or Firm* — Fish & Richardson P.C.

(57) ABSTRACT

A method of eliminating interference at an optical sensor of a mobile device that receives light from multiple light sources. The mobile device includes an optical navigation module having a cover and an illumination device disposed around the periphery of the cover. The optical navigation module includes an optical sensor that detects light reflected from an object contacting the cover. A processor receives electrical signals from the optical sensor and interprets movement of the object. The method reduces interference between the light source of the optical navigation module and the light source of the illumination device by controlling emission of light rays from each light source. The emission of light rays may be controlled based on timing, frequency and/or coding domains.

10 Claims, 6 Drawing Sheets

OPTICAL NAVIGATION MODULE WITH DECORATION LIGHT USING INTERFERENCE AVOIDANCE METHOD

FIELD OF THE TECHNOLOGY

The disclosure relates to mobile devices. More particularly, the disclosure relates to mobile devices having an optical navigation device and a decoration light source.

BACKGROUND

Electronic communication devices enable a variety of functions including, for example, telephonic functions, electronic messaging functions and other personal information manager application functions. Due to the flexibility of handheld communication devices, users are becoming more dependent on handheld communication devices and use these devices in various environments, including environments with poor lighting. Some handheld communication device manufacturers have responded by adding lighting features to the handheld communication devices. Known lighting features include an illuminated navigation device. The different illumination features allow users to operate the handheld communication devices under poor lighting conditions. Many illuminated navigation devices incorporate an illuminated halo ring or decorative light source around an optical touch pad. However, the halo ring and decorative light source have various drawbacks, including saturating and interfering with the operation of the optical sensor.

DETAILED DESCRIPTION

Figure 1:
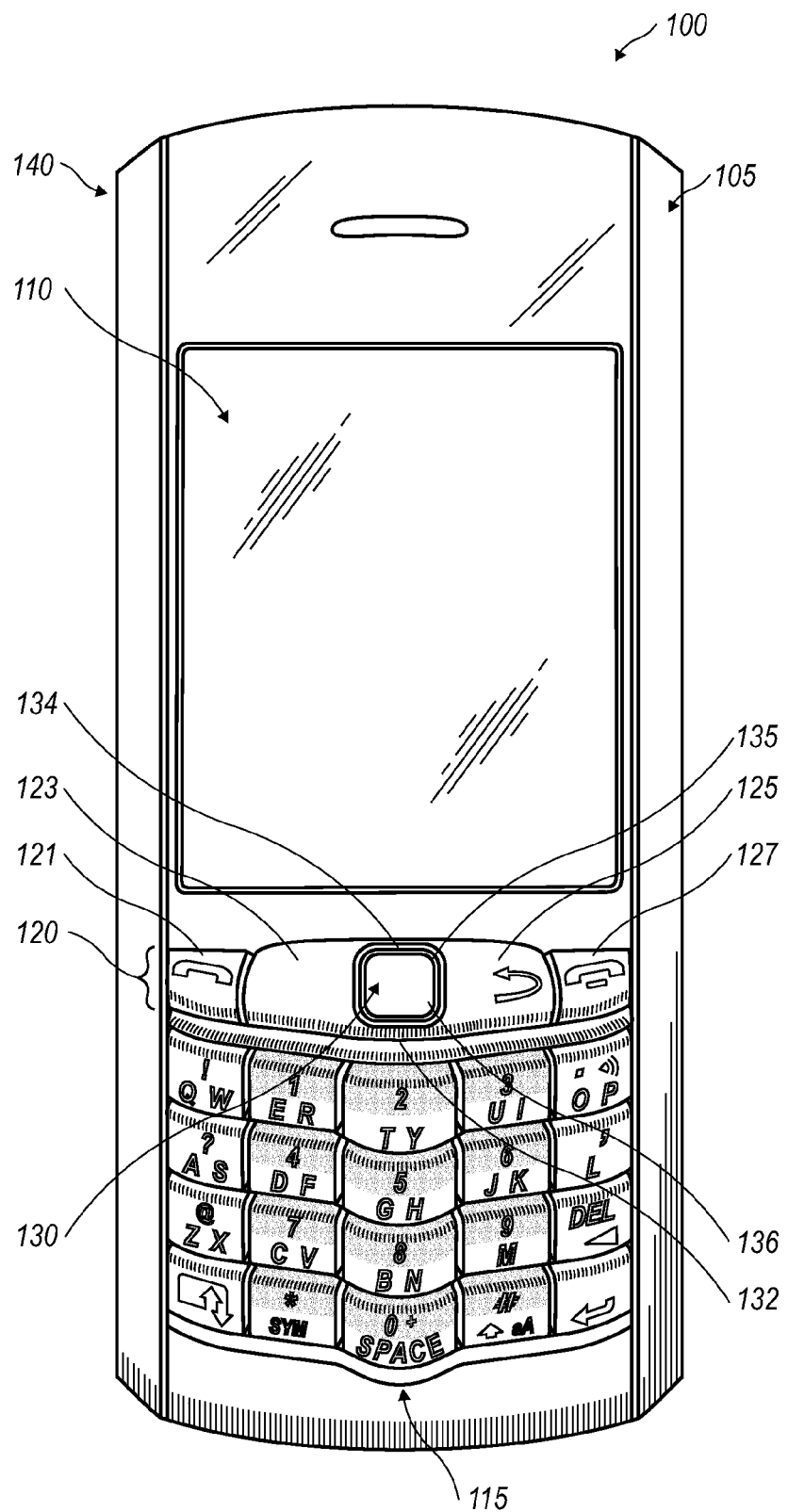
FIG. 1 is a front view of a mobile device having an optical navigation device according to one example of the disclosure.

The disclosure is directed to a mobile device having an optical navigation module surrounded by a halo ring or an illumination device. The optical navigation module includes an optical sensor that detects light. A processor in electrical communication with the optical sensor interprets movement of an object on a cover of the navigation module. A method is provided to reduce saturation of the optical sensor that may result from interference between the light source of the optical navigation module and the light source of the illumination device.

According to one aspect of the disclosure, a handheld communication device includes an optical navigation module having a cover with a top surface and a bottom surface, a navigation light source that illuminates at least one of the top surface and the bottom surface of the cover, a decorative light source that illuminates a periphery of the cover, and an optical sensor that detects light reflected into the optical navigation module and generates corresponding contact signals. The handheld communication device also includes a processor electrically coupled to the navigation light source, the decorative light source and the optical sensor. The processor operates to activate the navigation light source while concurrently deactivating the decorative light source, and activate the decorative light source while concurrently deactivating the navigation light source.

According to another aspect of the disclosure, a handheld communication device includes an optical navigation module having a cover with a top surface and a bottom surface, a navigation light source that transmits light in response to receiving a first signal having a first wavelength to illuminate at least one of the top surface and the bottom surface of the cover, a decorative light source that transmits light in response to receiving a second signal having a second wavelength, the second wavelength being different than the first wavelength. The decorative light source illuminates a periphery of the cover and an optical sensor detects light having the first wavelength that is reflected from an external object that contacts the top surface of the cover to generate corresponding contact signals. The contact signals are transmitted to a processor that is electrically coupled to the optical sensor to perform a navigation operation on a display of the handheld communication device.

According to yet another aspect of the disclosure, a handheld communication device includes an optical navigation device having a cover with a top surface and a bottom surface, a navigation light source that illuminates at least one of the top surface and the bottom surface of the cover, a decorative light source that illuminates a periphery of the cover, and an optical sensor that detects light reflected from an external object that contacts the top surface of the cover to generate corresponding contact signals. The handheld communication device also includes a processor electrically coupled to the navigation light source, the decorative light source and the optical sensor. The processor generates a first control signal to operate the navigation light source, the first control signal being pulsed according to a first modulation code. The processor further generates a second control signal to operate the decorative light source, the second control signal being pulsed according to a second modulation code.

FIG. 1 illustrates a front view of a mobile device 100 according to one example. While the illustrated example depicts the mobile device 100 as a smart phone, the disclosure supports the mobile device 100 being a personal digital assistant (PDA), a laptop computer, a tablet computer, or other mobile device capable of sending and receiving electronic messages. The mobile device 100 may include a unibody construction, also known as a "candy-bar" design. In other examples, the mobile device 100 may include a "clamshell" design or a "slider" design, among other design styles.

The mobile device 100 may include a front face 105 having a display 110 located above a keyboard 115. The keyboard 115 may include a plurality of keys that are actuable to provide data input. The mobile device 100 also may include a row of programmable keys 120 that are programmable to perform selected functions. For example, programmable keys 120 may include a call send key 121, a menu key 123, an escape key 125 and a call end key 127, among other programmable keys. One of ordinary skill in the art will readily appreciate that the mobile device 100 may include other keys and programmable keys, including a greater number or a lesser number of keys and programmable keys.

According to one example, the mobile device 100 may include an optical navigation module 130 that generates signals for navigating content on the display 110. Optical navigation module 130 may be structured to enable one-dimensional, two-dimensional or three-dimensional navigation on the display 110, among enabling other functions. For example, optical navigation module 130 may include one or more sensor arrays having capacitive sensors or optical sensors, among other sensor types. The sensor arrays may generate signals for instructing cursor movement in substantially any direction on the display 110.

Optical navigation module 130 may include a cover 136 that is exteriorly located on the front face 105 of the mobile device 100. This location allows optical navigation module 130 to be thumb-actuable or finger-actuable, similar to the keys on the keyboard 115 and the programmable keys 120. The mobile device 100 may include an extended cover 132 that is dimensioned to overlay the optical navigation module 130 and adjacent programmable keys 123, 125, among other adjacent structures. The optical navigation module 130 may include at least one illumination ring 134 positioned around a perimeter of the cover 136 to outline a location of the underlying sensor arrays. As a result, users of the mobile device 100 receive a visual indication on the cover 136 of the sensing area for the navigation module 130. The cover 136 can have a decorative ring 135, such as a metallic ring, interposed between the illumination ring 134 and the cover 136. In other examples, the illumination ring 134 can be interposed between the decorative ring 135 and cover 136.

The extended cover 132 may be formed of a single-piece construction using various technologies, such as in mold decoration ("IMD") and in mold labels ("IML"), among other technologies. IMD and IML are versatile and cost effective technologies for decorating and manufacturing durable plastic parts. Additionally, the extended cover 132 may be manufactured from other materials including glass or a glass and plastic laminate, among other materials. The single-piece construction prevents contaminants from entering an interior portion of the mobile device 100 through a gap between the optical navigation module 130 and the adjacent programmable keys 123, 125. The single-piece construction also facilitates centering of the navigation module 130 on the mobile device 100 and minimizes tilting of optical navigation module 130 upon placement in the mobile device 100.

The extended cover 132 may be constructed with sufficient flexibility to enable actuation of the menu key 123, the escape key 125 and optical navigation module 130 by applying a force thereto. For example, the extended cover 132 may be constructed to flex in a direction perpendicular to the surface when a depression force is applied thereto. The extended cover 132 is also constructed with sufficient rigidity to provide support for objects that track along the cover 136. The optical navigation module 130 may be located on the front face 105 of the mobile device 100 and may be positioned in an area between the keyboard 115 and the display 110. In this location, the optical navigation module 130 may avoid interfering with the keyboard 115 during typing. Furthermore, in this location, the optical navigation module 130 does not block the operator's view of the display 110 during use. One of ordinary skill in the art will readily appreciate that the optical navigation module 130 may be positioned at other locations on the mobile device 100.

The mobile device 100 may include a reduced QWERTY keyboard 115. Alternatively, the mobile device 100 may include other keyboard configurations, including a full size keyboard or a virtual keyboard provided on a touch screen display (not shown). Each key of the keyboard 115 may be associated with at least one alphabetic character, numeral or command, among other data items. The commands may include a space command or a return command, among other commands. The plurality of the keys may include alphabetic characters and may be arranged in various known layouts, including a QWERTY layout (as shown in FIG. 1), a QZERTY layout, a QWERTZ layout, an AZERTY layout, a Dvorak layout, a Russian keyboard layout, a Chinese keyboard layout, or other known layouts. These known layouts are provided by way of example and other known layouts are considered within the scope of this disclosure. The keyboard layout may be selected based on a desired geographical region of operation. Additionally, the keyboard 115 may be interchangeable such that a user may switch between keyboard layouts.

The mobile device 100 may include a body 140 that is sized to be held in one hand during use. The display 110 may be provided on the front face 105 of the body 140 to enable data display and to facilitate sending and receiving messages, including voice and data messages. The mobile device 100 may include components, such as a camera or video recorder to enable recording of digital images. One of ordinary skill in the art will readily appreciate that the mobile device 100 may include other components.

Figure 2:
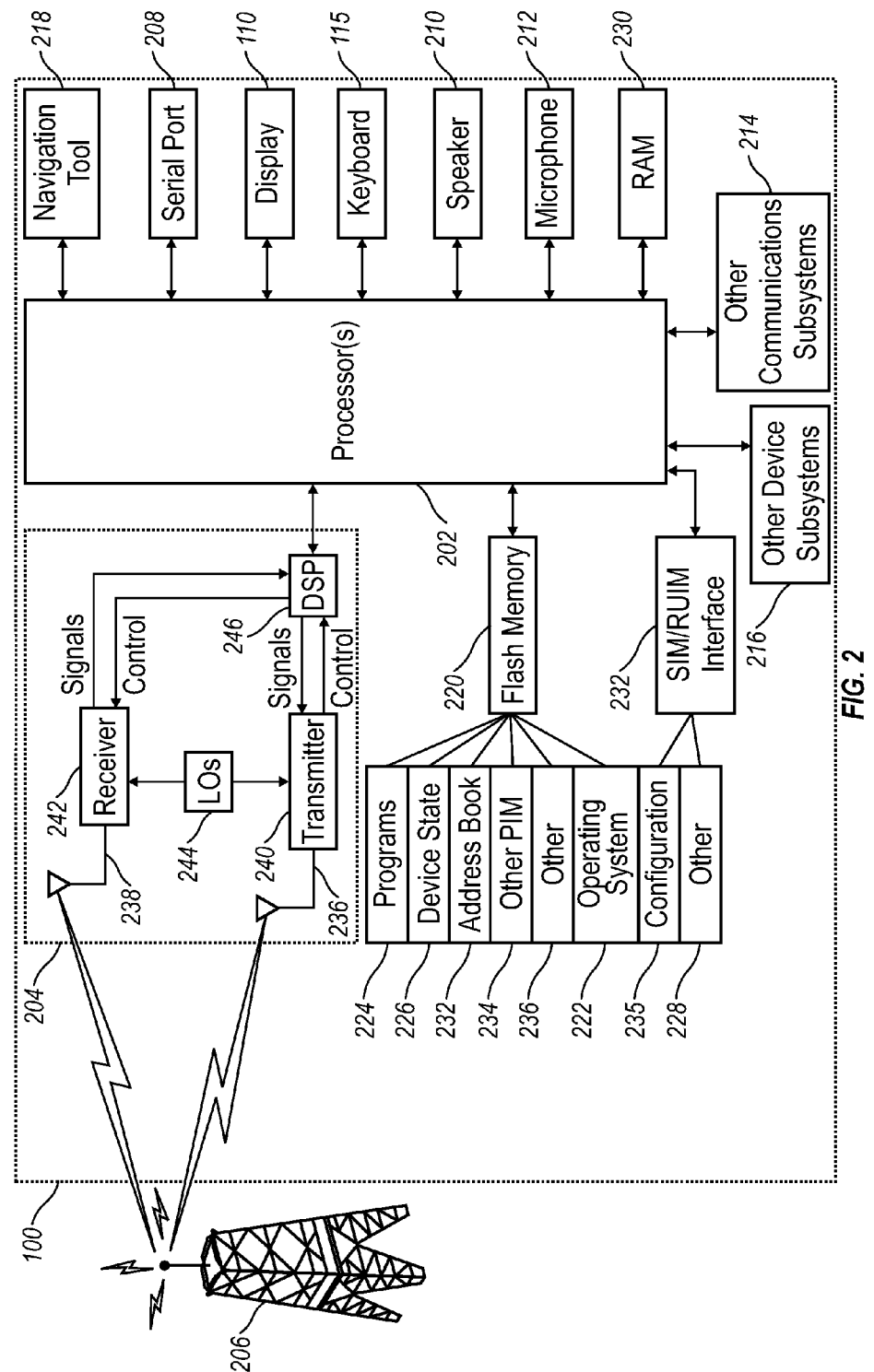
FIG. 2 is a block diagram representing a handheld communication device interacting in a communication network in accordance with an example of the disclosure.

FIG. 2 illustrates a block diagram of the mobile device 100 in a communication network in accordance with an exemplary implementation. One of ordinary skill in the art will readily appreciate that additional elements and modifications may be necessary to make the mobile device 100 work in particular network environments.

The mobile device 100 can include a microprocessor 202 that controls the operation of the mobile device 100, such as facilitating communications, generating a graphical user interface, executing programs, and so forth. A communication subsystem 204 performs communication transmission and reception with a wireless network 206. The microprocessor 202 may be coupled to a serial port 208 (for example, a Universal Serial Bus port) that facilitates communication with other devices or systems via the serial port 208. Display 110 may be communicatively coupled to the microprocessor 202 to facilitate display of information to an operator of the mobile device 100. When the mobile device 100 is equipped with keyboard 115, which can be physical or virtual (for example, displayed as images of keys rendered on a touch screen), the keyboard 115 can be communicatively coupled to the microprocessor 202. The mobile device 100 can include one or more speakers 210 and one or more microphones 212, which can advantageously be communicatively coupled to the microprocessor 202 and are discussed in further detail below. Other communication subsystems 214 and other mobile device subsystems 216 are generally indicated as communicatively coupled with the microprocessor 202. An example of a communication subsystem 214 is a short-range communication system such as a BLUETOOTH® communication module or a Wi-Fi® communication module (i.e. a communication module in compliance with IEEE 802.11b, g or n) and associated circuits and components. Additionally, the microprocessor 202 may perform operating system functions and may execute programs or software applications on the mobile device 100. In some implementations, not all of the above components are included in the mobile device 100. An auxiliary I/O subsystem may include one or more different navigation tools 218 (multi-directional or single-directional), external I/O devices such as keyboards, and other subsystems capable of providing input or receiving output from the mobile device 100.

Figure 3:
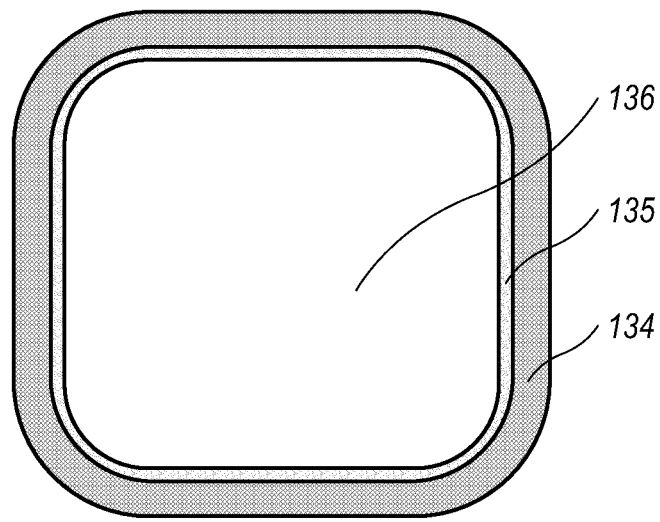
FIG. 3 is a top view of an optical navigation module with a chrome-like ring interposed between a navigation pad and an illumination ring in accordance with an example of the disclosure.
Figure 4:
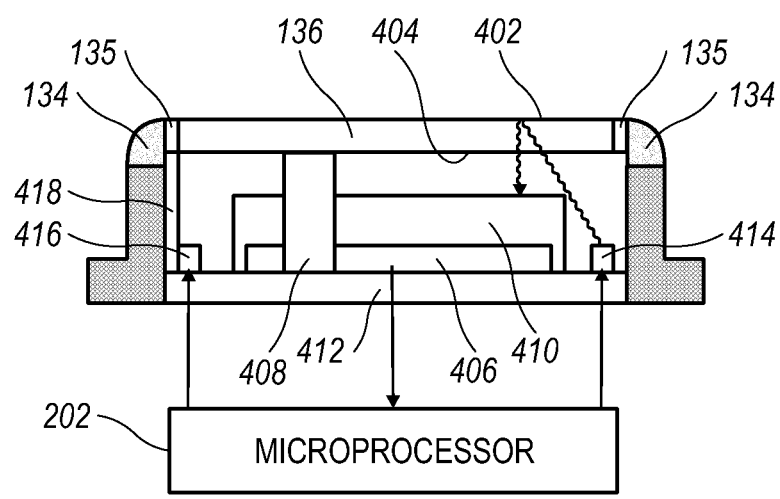
FIG. 4 is a cross sectional view of an optical navigation module with an illumination ring interposed between a navigation pad and a chrome-like ring in accordance with an example of the disclosure.

The auxiliary I/O subsystem may take the form of a variety of different navigation tools 218 (multi-directional or single-directional), such as an optical navigation module or tool, as illustrated in the example shown in FIG. 1 and as shown in more detail in FIGS. 3 and 4. In other examples, auxiliary I/O subsystem may include a trackball, a thumbwheel, a navigation pad, a joystick, a touch-sensitive interface, or other I/O interface. The navigation tool 218 may be located on a front face 105 of the mobile device 100 or may be located on any exterior surface of the mobile device 100. Other auxiliary I/O subsystems may include external display devices and externally connected keyboards (not shown). While the above examples have been provided in relation to the auxiliary I/O subsystem, other subsystems capable of providing input or receiving output from the mobile device 100 are considered within the scope of this disclosure. Additionally, other keys may be placed along the side of the mobile device 100 to perform selected functions and may include escape keys, volume control keys, scrolling keys, power switches, or user programmable keys, and may likewise be programmed accordingly.

The mobile device 100 may be equipped with components to enable operation of various programs. A memory 220 may provide storage for the operating system 222, device programs 224, device state data 226, and so forth. The operating system 222 may be generally configured to manage other programs 224 that may be stored in the memory 220 and may be executable on the processor 202. The operating system 222 may handle requests for services made by programs 224 through predefined program interfaces. More specifically, the operating system 222 may typically determine an order in which the programs 224 are executed on the processor 202. The operating system 222 may determine an execution time allotted for each program 224, may manage sharing of the memory 220 among the programs 224, may handle input and output to and from other device subsystems 228, and so forth. In addition, users may interact directly with the operating system 222 through a user interface, typically including the keyboard 115 and the display 110. The operating system 222, programs 224, data, and other information may be stored in the memory 220, such as random access memory (RAM) 230, read-only memory (ROM), or another suitable storage element (not shown). An address book 232, a personal information manager (PIM) 234, and other information 236 may also be stored.

The mobile device 100 may be enabled for two-way communication within voice, data, or voice and data communication systems. A Subscriber Identity Module (SIM) or Removable User Identity Module (RUIM) may be utilized to authorize communication with the communication network 206. A SIM/RUIM interface 232 provided within the mobile device 100 may interface a SIM/RUIM card (not shown) to the microprocessor 202 and may facilitate removal or insertion of a SIM/RUIM card. The SIM/RUIM card may include a memory and may hold key configurations 235 and other information 228, such as identification and subscriber related information. The mobile device 100 may be equipped with an antenna 236 for transmitting signals to the communication network 206 and another antenna 238 for receiving communication from the communication network 206. Alternatively, a single antenna (not shown) may be utilized to both transmit and receive signals. The communication subsystem 204 may include a transmitter 240 and receiver 242, one or more antennae 236, 238, local oscillators (LOs) 244 and a processing module 246, such as a digital signal processor (DSP).

The mobile device 100 may include a touch-sensitive display or touch screen that includes one or more touch location sensors, an overlay, and a display 110, such as a liquid crystal display (LCD) or light emitting diode (LED) display. The touch location sensor(s) may be a capacitive, resistive, infrared, surface acoustic wave (SAW), or other type of touch-sensitive sensor and can be integrated into the overlay. The overlay, or cover, can be comprised of laminated glass, plastic, or other suitable material(s) and is advantageously translucent or transparent. A touch or touch contact can be detected by the touch screen and processed by the processor 202, for example, to determine a location of the touch. Touch location data may include a center of the area of contact or the entire area of contact for further processing. A touch may be detected from a contact member, such as a body part of a user, for example a finger or thumb, or other objects, for example a stylus, pen, or other pointer, depending on the nature of the touch location sensor.

As shown in FIG. 3, the optical navigation module 130 can have a decorative ring 135 interposed between the illumination ring 134 and a cover 136. Specifically, the illumination ring 134 is provided around a perimeter of the decorative ring 135 which is provided around a perimeter of the cover 136. In another example, the optical navigation module 130 can have the illumination ring 134 interposed between the decorative ring 135 and the cover 136. Specifically, in this example, the decorative ring 135 is positioned around a perimeter of the illumination ring 134, which is provided around a perimeter of the cover 136.

As shown in FIG. 3, the illumination ring 134 and decorative ring 135 can be substantially square-shaped with rounded corners. In one or more other examples, the illumination ring 134, decorative ring 135 or both rings 134, 135, can be different shapes. The illumination ring 134 can be made of a translucent material or materials (such as, but not limited to plastic) that allows light to pass through the illumination ring 134. The decorative ring 135 can be made using an opaque material or materials which can reduce or prevent light from passing therethrough; or the decorative ring 135 can be made using a translucent material or materials that allows light to pass through. The decorative ring 135 can be made of a material or materials that provide a metal-like texture, finish or both (e.g., chrome-like). The illumination ring 134 and the decorative ring 135 can be made of a non-conductive material or materials which reduce electric static discharge (ESD).

The illumination ring 134, the decorative ring 135, or both rings 134, 135 can be made using a non-conductive vacuum metallization (NCVM) coating. In at least one example, other methods or materials can be used to create the illumination ring 134, the decorative ring 135, or both rings 134, 135. An NCVM coating can assist in reducing ESD. NCVM can provide a metal film or thin metal film over a resin surface. The metal film can provide a metal-like appearance (e.g., texture, finish or both). The metal-like appearance can be a chrome-like appearance. A handheld communication device 100 having a metal-like appearance is desirable by some users. The thin metal film can be coated with an ultra violet (UV) coating to provide a surface hardness and adhesion comparable to plating. The NCVM coating can be applied using two different processes: general disposition and discontinuous deposition.

Using the general deposition process, the metal can be splattered onto the resin surface using vaporized metal (such as, but not limited to, tin) rods to provide metal deposits that allows light to pass through small gaps in the metal deposits. The discontinuous deposition process provides a thicker, more consistent metal layer that can reduce or prevent light from passing through the metal deposits. Using the general disposition process for the illumination ring 134, the decorative ring 135, or both rings 134, 135, can allow light to pass through one or both rings 134, 135. Thus, the decorative ring 135 can reduce or prevent light from passing through in one or more embodiments or can allow light to pass through in one or more embodiments. For embodiments in which the decorative ring 135 allows light to pass through, the light can pass through the decorative ring 135 from the bottom out, e.g., when the decorative ring 135 is backlit. Allowing light to pass through one or both rings 132, 135 can provide illumination to identify a location of the cover 136 on the handheld electronic device 100 in poor lighting conditions.

In at least one example, the illumination ring 134 and decorative ring 135 can be one ring, e.g., the decorative ring 135 that can be illuminated, with approximately the same amount of metal deposition throughout or with different amounts of metal deposition with one of the rings, e.g., the illumination ring 134, having one amount of metal deposition and the other ring, e.g., the decorative ring 135, having a different amount of metal deposition. In other examples, the illumination ring 134 and decorative ring 135 can be made using non-NCVM materials. For example, the illumination ring 134 can be made using a translucent material and the decorative ring 135 can be made using an opaque material.

FIG. 4 is a cross sectional view of the optical navigation module 130 with the decorative ring 135 interposed between the illumination ring 134 and the cover 136. In FIG. 4, the optical navigation module 130 can include the cover 136 having a top surface 402 and a bottom surface 404. The optical navigation module 130 can include an optical sensor 406, a capacitive sensor 408, or both. The optical sensor 406 and capacitive sensor 408 can be positioned below the bottom surface 404 of the cover 136. The optical sensor 406 can be configured to detect two-dimensional movement of an object about an X axis, Y axis or both when the object is in contact with the top surface 402 of the cover 136. A lens 410 can be optically coupled to the optical sensor 406. The lens 410 can improve the field of view of the optical sensor 406. The lens 410 can be dimensioned similar to the cover 136 to improve the field of view for the optical sensor 406 to include the entire top surface 402 of the cover 136, e.g., to detect an object (not shown) in contact or in proximity to the top surface 402 of the cover 136. In at least one example, the optical sensor 406 can be an ADNS-5700 optical sensor and the lens 410 can be an ADNS-5100 round lens, ADNS-5100-001 trim lens, or the ADNS-5100-002 truncated round lens by Avago Technology of San Jose, Calif. In other examples, other optical sensors 406 and lenses 410 can be used. The optical sensor 406 and capacitive sensor 408 can be communicatively coupled to a printed circuit board (PCB) 412. In at least one example, the PCB 412 is part of the navigation module 130. The PCB 412 can be communicatively coupled to the processor 202.

The navigation module 130 may include a first light source 414 such as, for example, an LED (light emitting diode), a laser diode, an infrared (IR) light source, an ultraviolet (UV) light source, a high intensity laser, a bulb or light from any source. The first light source 414 directs light rays at the cover 136. An object (e.g., a user's thumb) contacting the cover 136 reflects the light rays onto the lens 410, where the light rays are focused through lens 410 and impinge the optical sensor 406. The optical sensor 406 generates corresponding sensor signals that are transmitted to the processor 202 to affect movement of a navigation icon along the X- and Y-axes of the display 110. The processor 202 controls activation of the first light source 414.

The navigation module 130 also includes one or more second light sources 416 that include a light emitting diode (LED), a white LED, or any other suitable light source that can produce light rays. When the second light source 416 is activated, light rays travel through the illumination ring 134 to provide illumination to the cover 136. In at least one example, one or more light pipes 418 can be provided to guide the second light source 416 to the illumination ring 134, the decorative ring 135, or both rings 134, 135. The processor controls activation of the second light source 416.

As mentioned above, the processor 202 controls operation of both the first light source 414 and the second light source 416. Advantageously, the technology provides a method to reduce interference at the optical sensor 406 from light rays generated by the two light sources. In one example, the technology reduces interference by regulating operation of the first light source 414 and the second light source 416, such that only one of the two light sources actively produces light rays at any given time.

Figure 5:
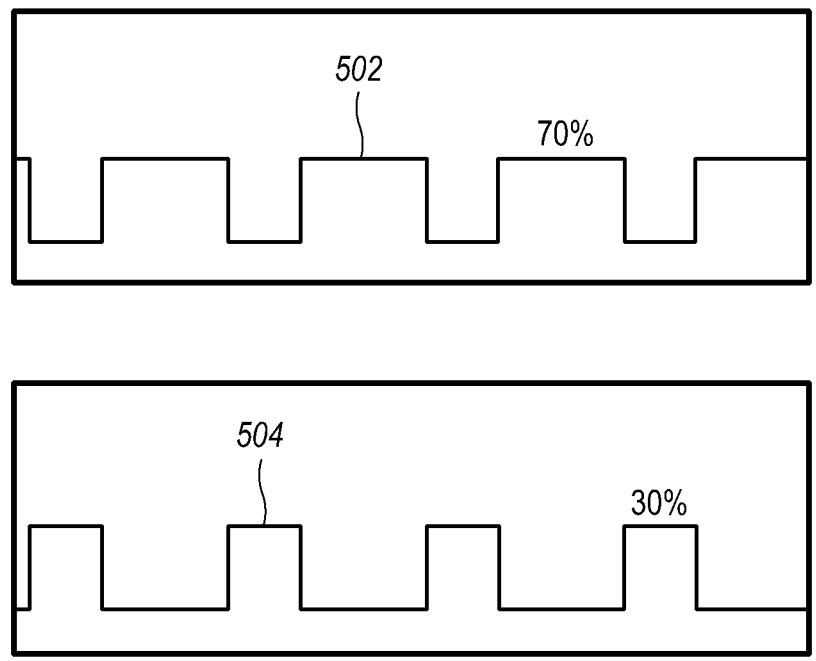
FIG. 5 is a diagram showing pulse width modulation signals that drive an illumination ring and an optical sensor light source in accordance with an example of the disclosure.

FIG. 5 illustrates pulse width modulation ("PWM") signals that drive the first light source 414 and the second light source 416. The PWM signals are digitally encoded analog signals. The PWM signal represents a voltage or current source being periodically applied to a load, i.e., by a series of repeated on and off pulses. "On-time" is defined when a DC or voltage applied to a load. "Off-time" is defined when the supply is switched off.

Referring to FIG. 5, a first PWM signal 502 represents an example output signal with a 70% duty cycle that is applied to the second light source 416. The 70% duty cycle means a voltage or current is applied to generate a signal for 70% of a given time period and the voltage is switched off the remaining 30% of the time. The cycling of on-time and off-time is repeated at a specified frequency, i.e., 30 MHz. The first PWM signal 502 drives the second light source 416 to illuminate the illumination ring 134. During the time that the first PWM signal 502 is off, a second PWM signal 504 is on. The second PWM signal 504 drives the output of the first light source 414 that is optically matched with the optical sensor 406. The second PWM signal 504 has a duty cycle of 30% and is driven during the time that the first PWM signal 502 is off. The duty cycles discussed above are examples only and the disclosure is not limited to any specific duty cycle or frequency. However, whatever the duty cycles of the PWM signals 502 and 504 are, they are mutually exclusive, i.e., one is on while the other is off. Thus, the processor 202 can modulate the first PWM signal 502 and the second PWM signal 504 such that only one of the two signals is generated at a time. Thus, interference is avoided at the optical sensor 406 by preventing both light sources from operating simultaneously. By optimizing the frequency and duty cycles of each PWM signal to take advantage of human visual limitations, the user of mobile device 100 will not visually detect the light source modulation and instead will perceive the illumination ring 134 as being continuously illuminated.

Figure 6:
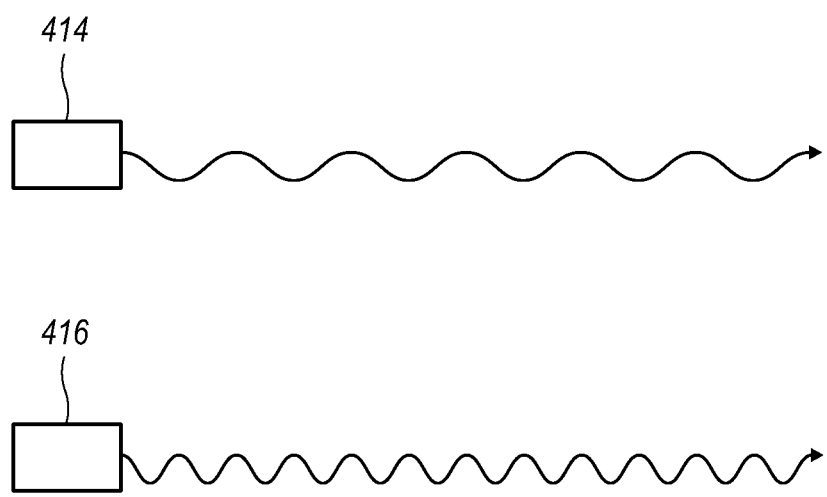
FIG. 6 is a diagram showing signals that drive a first light source and a second light source, each signal having a different frequency in accordance with an example of the disclosure.

FIG. 6 illustrates another example of the technology where each light source 414, 416 transmits light at different wavelengths. Thus, interference is avoided at the optical sensor 406 from light transmitted by the two light sources 414, 416. For example, the first light source 414 operates at a wavelength recognized by the optical sensor 406 to detect an object on the cover 136, where the wavelength may correspond to infrared radiation, i.e., between 0.01 and $7\times10^{-5}$ centimeters. The second light source 416 may transmit at a wavelength that corresponds to the visible spectrum, i.e. between $7\times10^{-5}$ and $4\times10^{-5}$ centimeters. Different colors of the visible spectrum can be chosen to illuminate the illumination ring 134, depending on user preference. For example, the illumination ring 134 can be illuminated by light at a wavelength corresponding to white, red, green, blue, or some other color, or some combination of these or other colors. Thus, by transmitting electromagnetic waves from the first light source 414 at a first wavelength and the second light source 416 at a second wavelength, interference may be avoided at the optical sensor 406 from light transmitted by each light source 414, 416. The technology enables selection of colors corresponding to user preference to illuminate the illumination ring 134.

Figure 7:
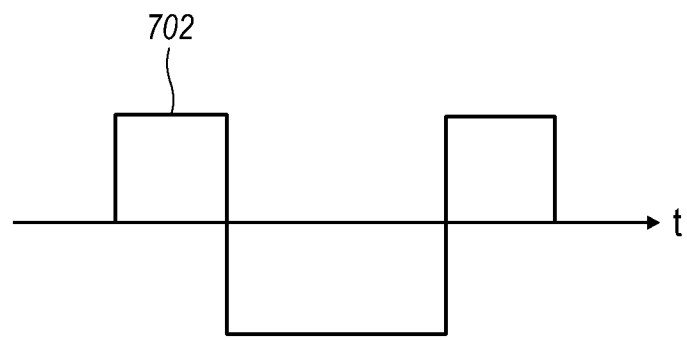
FIG. 7 is a diagram showing two mutually orthogonal signals that drive a first light source and a second light source in accordance with an example of the disclosure.
Figure 7:
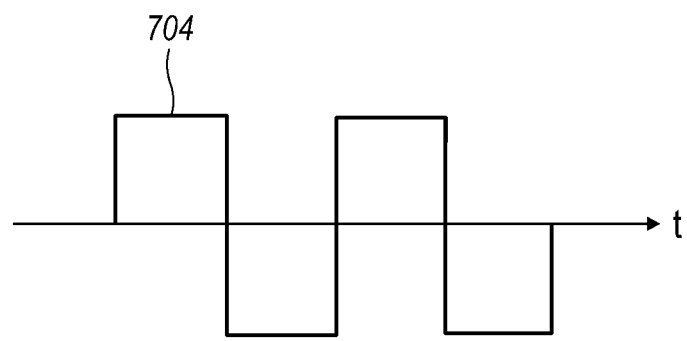

FIG. 7 illustrates yet another example of the technology having a first control signal 702 and a second control signal 704. The processor 202 generates the first control signal 702 in order to intermittently activate the first light source 414 to illuminate the cover 136 for navigation purposes. The generated first control signal 702 can be transmitted to the first light source 414 via one of communication systems 214, 216. The processor 202 generates the second control signal 704 in order to intermittently activate the second light source 416 to illuminate a periphery of the cover 136, and, in certain examples, the illumination ring 134 is disposed around the periphery of the cover 136. The generated second control signal 704 can be transmitted to the second light source 416 via communication system 216.

Each control signal 702, 704 is pulsed according to a modulation code. Control signal 702 is pulsed according to a first modulation code and control signal 704 is pulsed according to a second modulation code. The optical sensor 406 detects the modulation codes generated by the first light source 414 and the second light source 416 to distinguish between the multiple light sources. Each light source 414, 416 is programmed to communicate a unique modulation code that is detected by the optical sensor 406. By using different modulation codes for each light source 414, 416, interference may be avoided at the optical sensor 406 from light rays transmitted concurrently by the light sources 414, 416. In one example, the modulation code used to modulate control signal 704 is orthogonal to the modulation code used to modulate control signal 702. The first modulation code may be detected by the optical sensor 406 and light rays generated by the first light source 414 may be processed at the processor 202. By contrast, the processor 202 may be programmed to not process signals received from the optical sensor 406 that correspond to the second modulation code generated by the second light source 416.

Figure 8:
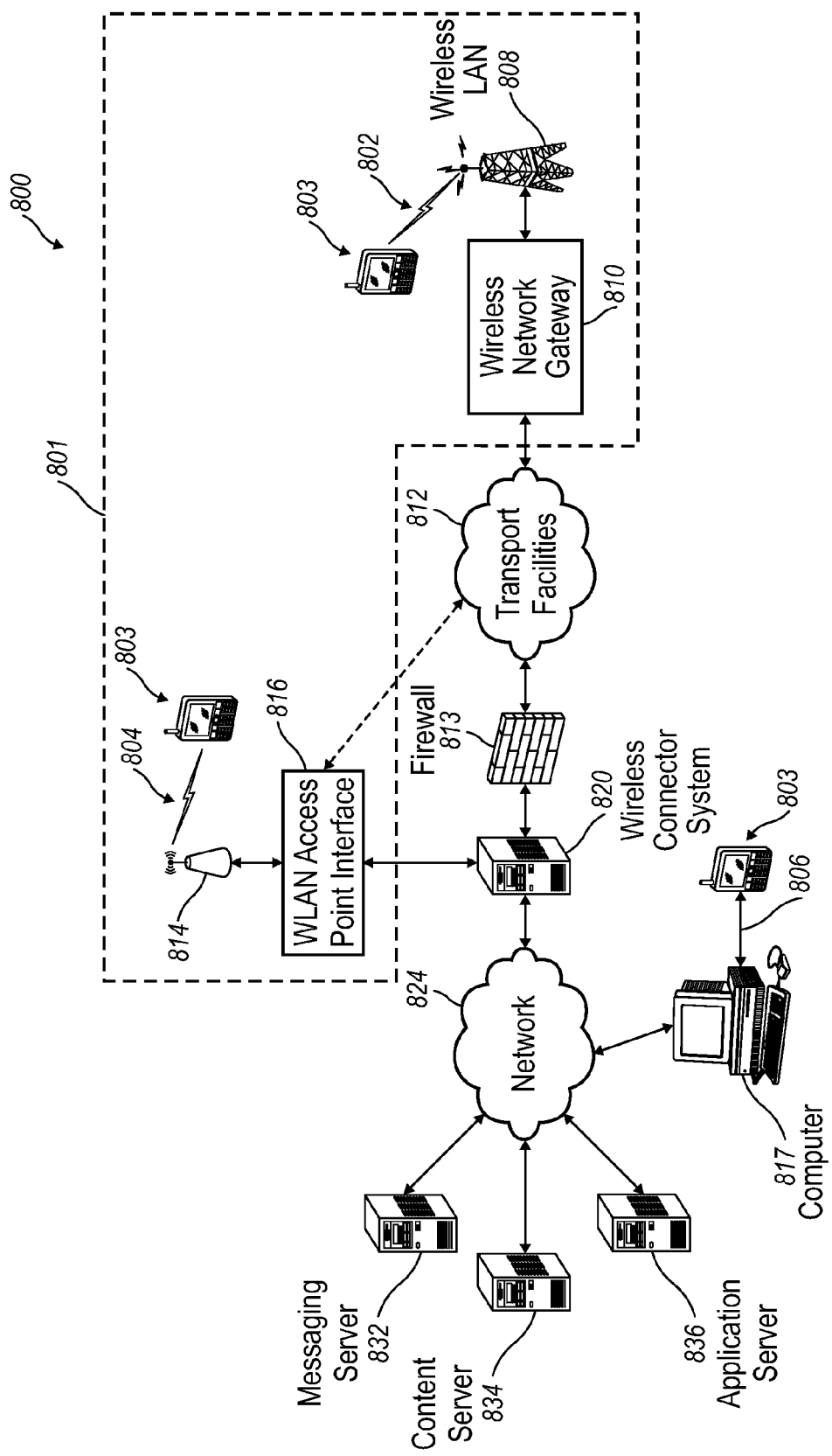
FIG. 8 is an operating environment for a communication system according to one example of the disclosure.

FIG. 8 illustrates an example of an operating environment for a communication system 800 that may include a number of modular communication devices 803, including mobile communication devices. The communication system 800 may be coupled to the modular communication devices 803 in any of several different ways. The modular communication devices 803 may be coupled to a wireless network 801, such as one or more of a Wireless Wide Area Network (WWAN) 802 and a Wireless Local Area Network (WLAN) 804, among other suitable network arrangements. In some examples, the modular communication devices 803 may be configured to communicate over both the WWAN 802 and WLAN 804, and to roam between these networks. In some examples, the wireless network 801 may comprise multiple WWANs 802 and WLANs 804, among other configurations.

The WWAN 802 may be implemented as any suitable wireless access network technology. By way of example, but not limitation, the WWAN 802 may be implemented as a wireless network that includes a number of transceiver base stations 808 (one of which is shown in FIG. 8), where each of the base stations 808 provide wireless Radio Frequency (RF) coverage to a corresponding area or cell. The WWAN 802 typically is operated by a mobile network service provider that provides subscription packages to users of the modular communication devices 803. In some embodiments, the WWAN 802 may conform to one or more of the following wireless network types: Mobitex Radio Network; DataTAC; GSM (Global System for Mobile Communication); GPRS (General Packet Radio System); TDMA (Time Division Multiple Access); CDMA (Code Division Multiple Access); CDPD (Cellular Digital Packet Data); iDEN (integrated Digital Enhanced Network); Ev-DO (Evolution-Data Optimized); CDMA2000; EDGE (Enhanced Data rates for GSM Evolution); UMTS (Universal Mobile Telecommunication Systems); HSPDA (High-Speed Downlink Packet Access); IEEE 802.16e (also referred to as Worldwide Interoperability for Microwave Access or "WiMAX"), or various other networks. While WWAN 102 is described herein as a "Wide-Area" network, that term is intended also to incorporate wireless Metropolitan Area Networks (WMAN) or other similar technologies for providing coordinated service wirelessly over an area larger than that covered by typical WLANs.

The WWAN 802 may communicate with a wireless network gateway 810 that couples the modular communication devices 803 to transport facilities 812. The transport facilities 812 couple the modular communication devices 803 to a wireless connector system 820. The transport facilities 812 may include one or more private networks or lines, the Internet, a virtual private network, or any other suitable network, among other transport facilities. The wireless connector system 820 may be operated, for example, by an organization or enterprise such as a corporation, university, or governmental department, among other organizations or enterprises, which allow access to a network 824, such as an internal or enterprise network (e.g., an intranet) and its resources. Alternatively, the wireless connector system 820 may be operated by a mobile network provider. In some examples, the network 824 may be realized using the Internet rather than, or in addition to, an internal or enterprise network.

The wireless network gateway 810 provides an interface between the wireless connector system 820 and the WWAN 802. The wireless network gateway 810 facilitates communication between the modular communication devices 803 and other devices (not shown) that may be connected, directly or indirectly, to the WWAN 802. Accordingly, communications sent via the modular communication devices 803 are transported via the WWAN 802, the wireless network gateway 810 and the transport facilities 812 to the wireless connector system 820. Communications sent from the wireless connector system 820 are received by the wireless network gateway 810 and transported via the WWAN 802 to the modular communication devices 803.

According to one example, the WLAN 804 includes a wireless network that conforms to IEEE 802.11x standards (sometimes referred to as Wi-Fi™) such as, for example, the IEEE 802.11a, 802.11b and/or 802.11g standard. One of ordinary skill in the art will readily appreciate that other communication protocols may be used for the WLAN 804, such as, IEEE 802.11n, IEEE 802.16e (also referred to as Worldwide Interoperability for Microwave Access or "WiMAX"), or IEEE 802.20 (also referred to as Mobile Wireless Broadband Access), among other communication protocols. The WLAN 804 includes one or more wireless RF Access Points (AP) 814 (one of which is shown in FIG. 8) that collectively provide a WLAN coverage area.

The WLAN 804 may be a user's personal network, an enterprise network, or a hotspot offered by an Internet service provider (ISP), a mobile network provider, or a property owner in a public or semi-public area, for example. The access points 814 may be connected to an access point (AP) interface 816 that may connect to the wireless connector system 820 directly or indirectly. A direct connection may be provided when the access point 814 is part of an enterprise WLAN 804 in which the wireless connector system 820 resides. An indirect connection may be provided via the transport facilities 812, as indicated by the dashed signal line in FIG. 8, if the access point 814 is a personal Wi-Fi network or Wi-Fi hotspot. In this case, a mechanism, such as a virtual private network (VPN), may be used for securely connecting to the wireless connector system 820. The AP interface 816 may provide translation and routing services between the access points 814 and the wireless connector system 820 to facilitate communication, directly or indirectly, with the wireless connector system 820.

The wireless connector system 820 may be implemented as one or more servers, and is typically located behind a firewall 813. The wireless connector system 820 manages communications, including email, Hypertext Transfer Protocol (HTTP), and HTTP Secure (HTTPS) communications to and from a set of managed modular communication devices 803. The wireless connector system 820 also provides administrative control and management capabilities over users and modular communication devices 803 that may connect to the wireless connector system 820.

The wireless connector system 820 allows the modular communication devices 803 to access the network 824 and connected resources and services such as a messaging server 832, a content server 834 for providing content, such as Internet content or content from an organization's internal servers; application servers 836 for implementing server-based applications, such as instant messaging (IM) applications to modular communication devices 803, and intranet file services; among other connected resources and services.

It will be appreciated that the above-described communication system 800 is provided for illustration purposes only. The above-described communication system 800 may be implemented using any of a multitude of network configurations for use with the modular communication devices 803. Suitable variations of the communication system 800 will be readily appreciated by a person of ordinary skill in the art and are intended to fall within the scope of the present disclosure.

The disclosure may be implemented using hardware or software in association with hardware. In some embodiments, the software may include firmware, resident software, microcode, a Field Programmable Gate Array (FPGA) or Application-Specific Integrated Circuit (ASIC), etc. In particular, for real-time or near real-time use, an FPGA or ASIC implementation is desirable.

Furthermore, the disclosure may take the form of a computer program product that includes program modules accessible from computer-usable or computer-readable medium storing program code for use by or in connection with one or more computers, processors, or instruction execution system. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium (though propagation mediums in and of themselves as signal carriers are not included in the definition of physical computer-readable medium). Examples of a physical computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. Both processors and program code for implementing each as aspect of the disclosure can be centralized or distributed (or a combination thereof) as known to those skilled in the art.

A data processing system suitable for storing a computer program product of the disclosure and for executing the program code of the computer program product will include at least one processor coupled directly or indirectly to memory elements through a system bus. The memory elements can include local memory employed during actual execution of the program code, bulk storage, and cache memories that provide temporary storage of at least some program code in order to reduce the number of times code must be retrieved from bulk storage during execution. Input/output or I/O devices (including but not limited to keyboards, displays, pointing devices, etc.) can be coupled to the system either directly or through intervening I/O controllers. Network adapters can also be coupled to the system to enable the data processing system to become coupled to other data processing systems or remote printers or storage devices through intervening private or public networks. Modems, cable modem and Ethernet cards are just a few of the currently available types of network adapters. Such systems can be centralized or distributed, e.g., in peer-to-peer and client/server configurations. In some embodiments, the data processing system is implemented using one or both of FPGAs and ASICs.

I claim:

1. A handheld communication device comprising:
    an optical navigation module comprising:
        a cover having a top surface and a bottom surface;
        a navigation light source that illuminates the cover;
        a decorative light source that illuminates a periphery of the cover; and
        an optical sensor that detects light reflected from an external object that contacts the top surface of the cover, the optical sensor generating corresponding contact signals; and
    a processor electrically coupled to the navigation light source, the decorative light source and the optical sensor, the processor operable to:
        activate the navigation light source while concurrently deactivating the decorative light source;
        activate the decorative light source while concurrently deactivating the navigation light source; and
        produces a digitally encoded first signal to control the navigation light source and a digitally encoded second signal to control the decorative light source, the digitally encoded first and second signals comprising a series of on-pulses and off-pulses.

2. The handheld communication device of claim 1, wherein the optical navigation module further comprises an illumination ring that is optically coupled to the decorative light source, the illumination ring disposed around the periphery of the cover.

3. The handheld communication device of claim 1, wherein the processor controls operation of the navigation light source and the decorative light source so that the digitally encoded first signal comprises an on-pulse when the digitally encoded second signal comprises and off-pulse and the digitally encoded first signal comprises an off-pulse when the digitally encoded second signal comprises an on-pulse.

4. The handheld communication device of claim 1, wherein the digitally encoded first and second signals are pulse width modulation signals.

5. The handheld communication device of claim 4, wherein the digitally encoded first signal has a first duty cycle and the digitally encoded second signal has a second duty cycle.

6. The handheld communication device of claim 5, wherein the digitally encoded first signal has a duty cycle of substantially 30% and the digitally encoded second signal has a duty cycle of substantially 70%.

7. The handheld communication device of claim 2, wherein the digitally encoded first signal and the digitally encoded second signal are configured such that the illumination ring is perceivable to be operating at a same time that the navigation pad is operating.

8. The handheld communication device of claim 1, wherein the digitally encoded first and second signals operate at substantially 30 MHz.

9. The handheld communication device of claim 1, wherein the optical sensor is positioned below the bottom surface of the cover.

10. The handheld communication device of claim 1, wherein the processor is programmed to detect movement of an object along one or both of an X axis and a Y axis when the object is in contact with the top surface of the cover.

\* \* \* \* \*